United States Patent
Cai et al.

(10) Patent No.: US 10,020,419 B2
(45) Date of Patent: Jul. 10, 2018

(54) FOUR-ELEMENT LIGHT EMITTING DIODE WITH TRANSPARENT SUBSTRATE AND PREPARATION METHOD

(71) Applicant: XIAMEN SANAN OPTOELECTRONICS TECHNOLOGY CO., LTD., Xiamen (CN)

(72) Inventors: Kunhuang Cai, Xiamen (CN); Shu-fan Yang, Xiamen (CN); Chun-Yi Wu, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 15/408,425

(22) Filed: Jan. 18, 2017

(65) Prior Publication Data
US 2017/0125630 A1    May 4, 2017

Related U.S. Application Data

(63) Continuation of application No. PCT/CN2015/073467, filed on Mar. 2, 2015.

(30) Foreign Application Priority Data

Aug. 15, 2014 (CN) .......................... 2014 1 0404330

(51) Int. Cl.
*H01L 29/15* (2006.01)
*H01L 33/00* (2010.01)
(Continued)

(52) U.S. Cl.
CPC ...... *H01L 33/0079* (2013.01); *H01L 33/0066* (2013.01); *H01L 33/22* (2013.01); *H01L 33/30* (2013.01)

(58) Field of Classification Search
CPC ..... H01L 33/0079; H01L 33/22; H01L 33/30; H01L 33/0066
(Continued)

(56) References Cited

U.S. PATENT DOCUMENTS 7,998,768 B1    8/2011  Horng et al.
8,138,516 B2 *  3/2012  Unno .................... H01L 33/382
                                                257/103
(Continued)

FOREIGN PATENT DOCUMENTS

CN          103715324 A    4/2014

*Primary Examiner* — Vu A Vu
(74) *Attorney, Agent, or Firm* — Syncoda LLC; Feng Ma; Junjie Feng

(57) ABSTRACT

A four-element light emitting diode with a transparent substrate, comprising a AlGaInP light emitting diode (LED) epitaxial wafer, and the surface of a GaP layer of the AlGaInP-LED epitaxial wafer is roughened into a bonding surface, a film is plated on the bonding surface and is bonded with a transparent substrate, and finally a GaAs substrate is removed. The transparent bonding disclosed herein can replace the GaAs substrate made of light absorption materials with the transparent substrate by substrate transfer technology, increasing the light emitting efficiency of the light emitting diode chip and avoiding extremely low external quantum efficiency caused due to the limitations of the material of conventional AlGaInP light emitting diode and the substrate; in addition, with the support of the cut path pre-etching technology, back melting or splashing during the epitaxial layer cutting process is avoided, light emitting efficiency is increased and electric leakage risk is eliminated.

20 Claims, 6 Drawing Sheets

(51) Int. Cl.
*H01L 33/30* (2010.01)
*H01L 33/22* (2010.01)

(58) Field of Classification Search
USPC .......................................................... 257/76
See application file for complete search history.

(56) References Cited

U.S. PATENT DOCUMENTS

2005/0274970 A1* 12/2005 Ludowise ............... H01L 33/62
 257/99
2010/0084679 A1* 4/2010 Hsieh ...................... H01L 33/22
 257/98

* cited by examiner

FOUR-ELEMENT LIGHT EMITTING DIODE WITH TRANSPARENT SUBSTRATE AND PREPARATION METHOD

The present application is a continuation of, and claims priority to, PCT/CN2015/073467 filed on Mar. 2, 2015, which claims priority to Chinese Patent Application No. 201410404330.7 filed on Aug. 15, 2014. The disclosures of these applications are hereby incorporated by reference in their entirety.

BACKGROUND

Light emitting diode (LED) is a semiconductor light emitting device and has been widely used in indicator light and display screen and so on. White light emitting diode is the third-generation lighting source after the incandescent electric light and the fluorescent electric light, has become the target that lamp fixture and light source research institutions around the world are racing to develop and acquire, and is a popular industry of the future in lighting field.

Since the successful development of metal-organic chemical epitaxial growth technology, AlGaInP based materials are undergoing a rapid development and used for producing high power and high brightness red and yellow light emitting diodes. Although red light emitting diodes with AlGaInP based materials have been commercially produced and the light emitting diode with four-element (also referred to as "quaternary") alloy material as the multi-quantum well active region has a very high internal quantum efficiency, due to the restriction of the material itself and the substrate, the external quantum efficiency of conventional AlGaInP-LED is very low. A major reason for the poor light emitting efficiency of the conventional AlGaInP-LED is that the GaAs substrate is light-absorbing material, resulting in the absorption of a great amount of light by the GaAs substrate radiated from the active layer (MQW) to the direction of the substrate, and even the metal omni-directional reflector with the support of substrate transfer technology has been developed to replace the conventional GaAs substrate, the losses in a fixed percentage of the light radiated and reflected to the active layer still occur.

SUMMARY

The present disclosure provides a four-element (e.g., quaternary) light emitting diode with a transparent substrate and preparation method thereof to increase the light extracting rate of the light emitting diode chip, and avoid extreme low external quantum efficiency due to the limitations of the materials of the conventional AlGaInP-LED and the substrate.

To solve the above technical problem, the technical scheme proposed by some embodiments disclosed herein can include: a four-element light emitting diode with transparent substrate, comprising a AlGaInP light emitting diode (LED) epitaxial wafer, is provided, and the surface of a GaP layer of the AlGaInP-LED epitaxial wafer is roughened and acts as a bonding surface, a film is plated on the bonding surface and is bonded with a transparent substrate, and finally the GaAs substrate is removed.

Preferably, the film is a silicon oxide layer, a silicon nitride layer, an aluminum oxide layer, a magnesium chloride layer or the combination of two or more of them, and preferably, the film material is vapored by an electron beam and gained light extracting rate is designed and arranged based on the refraction index of the film material.

Preferably, the transparent substrate is made of sapphire, aluminum oxide or glass.

A method for preparing the above four-element light emitting diode with transparent substrate comprises the following steps:

(1) Roughen the surface of a GaP layer of the AlGaInP-LED epitaxial wafer into a bonding surface, and plate a film on the bonding surface;

(2) smoothen the surface of the film layer on the bonding surface in Step 1) to be Ra<1 nm to obtain a smooth light emitting diode chip; the smoothening follows the chemical mechanical polishing procedures, different polishing solutions and polishing pads are used for different film materials, and after the designed smoothening operation, the film surface has excellent flatness. The chemical mechanical polishing procedures include: wax the chip and press it onto a small millstone with the surface to be polished up, and then use Speedfam polisher to polish, absorb the millstone with a bearing, stick a polishing pad to the surface of a big millstone, spread the polishing solution at a rate of 30 cc/min all over the millstone, and polish the chip at a rate of 30 rpm with the big millstone for at least 15 min, after which the required flatness will be achieved.

(3) prepare the transparent substrate to be bonded, and place the light emitting diode chip smoothened in Step 2) and transparent substrate after cleaning in an activating agent and stir the solution for 5-10 min before taking them out;

(4) bond the light emitting diode chip is with the transparent substrate after they are activated in Step 3) and then bond them at high temperature and pressure to obtain the bonded semi-finished product;

(5) remove the GaAs substrate from the semi-finished product in Step 4) to obtain the light emitting diode chip with transparent substrate.

In some embodiments, the method further comprises Step 6) where the epitaxial layer on the corridor area of the path to be cut on the light emitting diode with transparent substrate obtained in Step (5) is etched to a depth of at least ½ of the thickness of the epitaxial layer.

Preferably, in Step (1), the surface of the GaP layer of the AlGaInP-LED epitaxial wafer is roughened following the steps below:

(a) add at least 10 g I2 powder to 1,600 ml $CH_3COOH$, stir the solution till it is homogeneous and then heat the solution to 40-45° C.;

(b) after the solution prepared in Step a) is kept at a stable temperature, add the mixture of HF, $HNO_3$ and $CH_3COOH$ at a volume ratio of 3:2:4 and then maintain the temperature of the solution at 35-40° C.; further, the volume ratio of $CH_3COOH$ at this step to $CH_3COOH$ at Step a) is 1:5;

(c) place AlGaInP-LED epitaxial wafer into the solution prepared in Step b) for roughening for 1-2 min.

Preferably, in Step (3), the activating agent is a solution containing hydrogen peroxide compound, and further preferably, the activating agent is a solution mixing $NH_4OH$ and $H_2O_2$ at ambient temperature with volume ratio of 1:1.

Preferably, in Step (4), the bonding is made at 360° C. and 150 kPa for at least 30 min.

Preferably, in Step (5), the method to remove the GaAs substrate is that: the semi-finished product after bonding in Step (4) is placed for 30 min in a substrate remover solution which is prepared by $NH_4OH$ and $H_2O_2$ at a volume ratio of 1:5, and the temperature of the substrate remover is 45° C.

In another aspect, a light-emitting system is provided, including a plurality of the quaternary LEDs each with a transparent substrate. Each LED with the transparent substrate is manufactured by the method described above. The light-emitting system can be used for lighting, display, signage, etc.

Various embodiments disclosed herein can have one or more of the following advantages and positive effects: with the application of the transparent bonding technology disclosed herein, the transparent substrate can replace the light absorbing GaAs substrate by substrate transfer technology; in addition, with the support of the cut path pre-etching technology, back melting or splashing during the epitaxial layer cutting process is avoided, light emitting efficiency is increased and electric leakage risk is eliminated.

DETAILED DESCRIPTION

Embodiment 1

Figure 1:
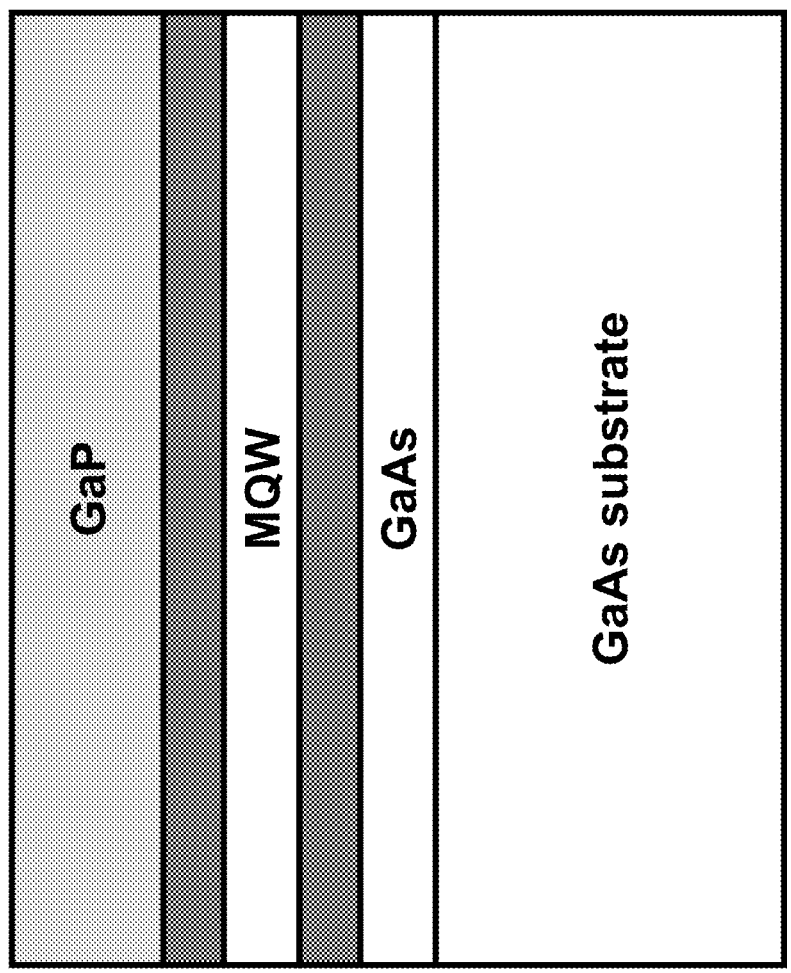
FIG. 1 is the structural diagram of AlGaInP-LEDGaP.
Figure 2:
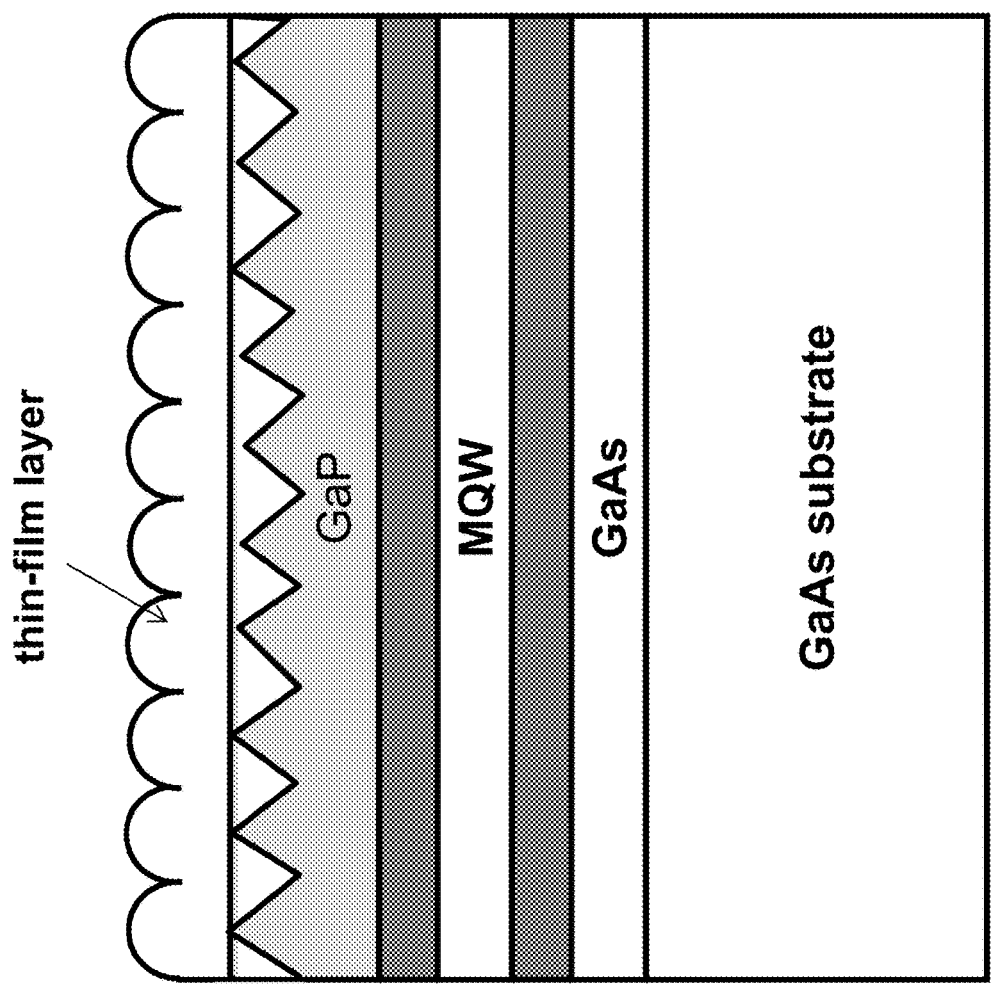
FIG. 2 is the structural diagram of AlGaInP-LEDGaP according to some embodiments after roughening and being plated with a film.
Figure 3:
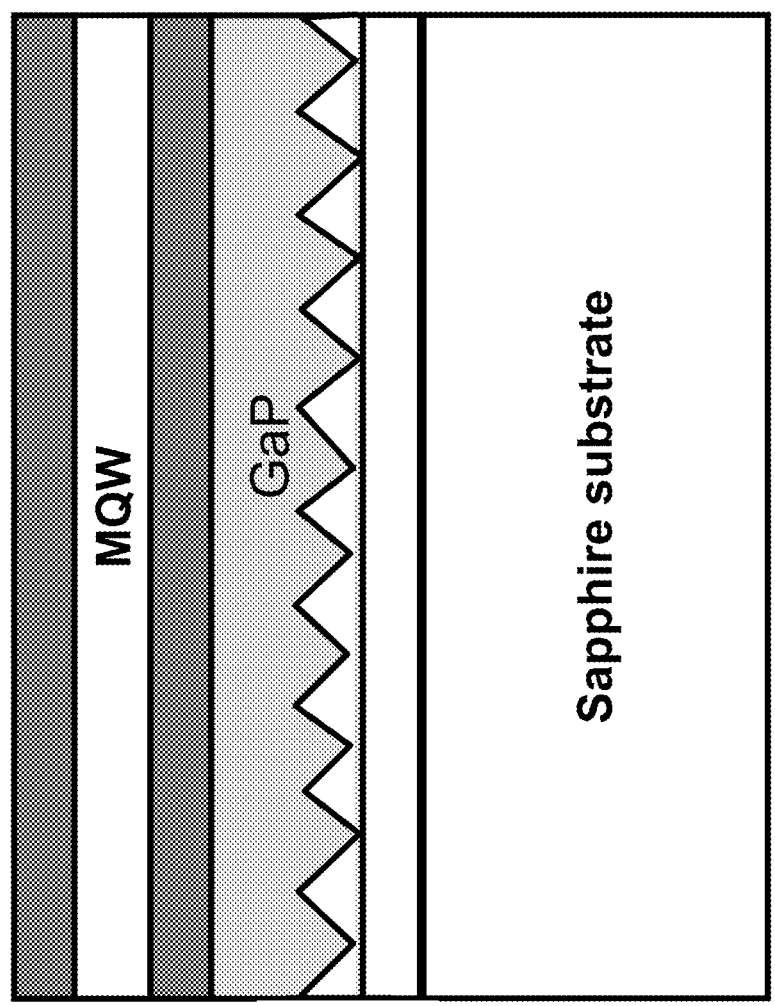
FIG. 3 is the structural diagram of AlGaInP-LED according to some embodiments after being added with sapphire by transparent bonding and with the GaAs substrate removed.
Figure 4:
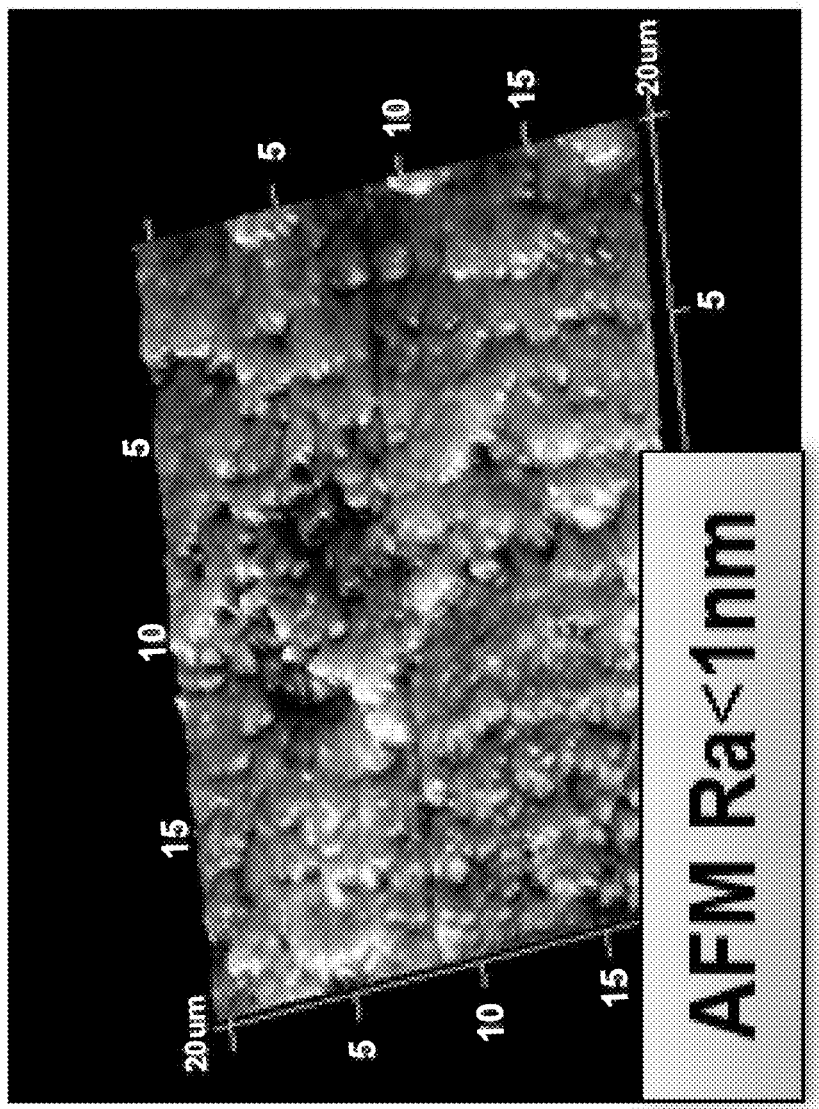
FIG. 4 is the schematic diagram of the AFM measurement after the leveling operation on the film layer surface according to some embodiments.

A method for preparing the above four-element light emitting diode with transparent substrate comprises the following steps:

(1) roughen the surface of a GaP layer of the AlGaInP-LED epitaxial wafer into a bonding surface, and plate a $Al_2O_3$ film and a $SiO_2$ film on the bonding surface by electronic beam; the $SiO_2$ film is 2 nm thick as the thickness of the layer to be polished should be sufficient for subsequent well polishing to certain flatness.

The GaP surface is roughened in the following steps:

(a) add 10 g I2 powder to 1,600 ml $CH_3COOH$, stir the solution till it is homogeneous and then heat the solution to 40° C.;

(b) after the solution prepared in Step a) is kept at a stable temperature, add the mixture of HF, $HNO_3$ and $CH_3COOH$ at a volume ratio of 3:2:4 and then maintain the temperature of the solution at 35° C.; further, the volume ratio of $CH_3COOH$ at this step to $CH_3COOH$ at Step (a) is 1:5;

(c) roughen the AlGaInP-LED epitaxial wafer in the solution prepared in Step (b) for 2 min.

(2) smoothen the surface of the film layer on the bonding surface in Step (1) to be Ra<1 nm to obtain a smooth light emitting diode chip; the smoothening follows the chemical mechanical polishing procedures with the support of ESR-320 polishing solution and SUBA600SiO$_2$ polishing pad to obtain the required flatness; ESR-320 polishing solution was brought from Yongguang Polishing Materials Co., Ltd., Zhongshan, Guangdong and SUBA600SiO$_2$ polishing pad from Speedfam Electronic Machinery (Shanghai) Co., Ltd.

(3) prepare the transparent sapphire substrate to be bonded, and place the light emitting diode chip smoothened in Step 2) and transparent substrate after cleaning in an activating agent and stir the solution for 6 min before taking them out; the contact between the polished film material and the activating agent can generate free radical such as hydrogen bond, increasing the binding capacity of the hydrogen bond between the film and the transparent substrate. The activating agent is the mixture of $NH_4OH$ and $H_2O_2$;

(4) bond the light emitting diode chip with the transparent sapphire substrate after they are activated in Step 3) and then bond them at high temperature and pressure to obtain the bonded semi-finished product with highly reliable binding capacity; the bonding is made at 360° C. and 150 kPa;

(5) remove the GaAs substrate from the semi-finished product in Step 4), and place the semi-finished product after bonding to a substrate remover solution for 30 min to obtain the light emitting diode chip with transparent substrate; the substrate remover solution is prepared by $NH_4OH$ and $H_2O_2$ at a volume ratio of 1:5, and the temperature of the substrate remover is 45° C.

Embodiment 2

A method for preparing the above four-element light emitting diode with transparent substrate comprises the following steps:

(1) roughen the surface of a GaP layer of the AlGaInP-LED epitaxial wafer into a bonding surface, and plate a SiNx film and a $SiO_2$ film on the bonding surface by electronic beam; the $SiO_2$ film is 3 μm thick as the thickness of the layer to be polished should be sufficient for subsequent well polishing to certain flatness;

The GaP surface is roughened in the following steps:

(a) add 10 g I2 powder to 1,600 ml $CH_3COOH$, stir the solution till it is homogeneous and then heat the solution to 45° C.;

(b) after the solution prepared in Step a) is kept at a stable temperature, add the mixture of HF, $HNO_3$ and $CH_3COOH$ at a volume ratio of 3:2:4 and then maintain the temperature of the solution at 35° C.; further, the volume ratio of $CH_3COOH$ at this step to $CH_3COOH$ at Step a) is 1:5;

(c) roughen AlGaInP-LED epitaxial wafer in the solution prepared in Step b) for 1 min.

(2) smoothen the surface of the film layer on the bonding surface in Step 1) to be Ra<1 nm to obtain a smooth light emitting diode chip; the smoothening follows the chemical mechanical polishing procedures with the support of ESR-320 polishing solution and SUBA600SiO$_2$ polishing pad to obtain the required flatness;

(3) prepare the transparent sapphire substrate to be bonded, and place the light emitting diode chip smoothened in Step 2) and transparent substrate after cleaning in an activating agent and stir the solution for 8 min before taking them out; the contact between the polished film material and the activating agent can generate free radical such as hydrogen bond, increasing the binding capacity of the hydrogen bond between the film and the transparent substrate. The activating agent is the mixture of $NH_4OH$ and $H_2O_2$ at volume ratio of 1:1;

(4) bond the light emitting diode chip with the transparent sapphire substrate after they are activated in Step 3) and then bond the light emitting diode chip and the MN substrate at high temperature and pressure to obtain the bonded semi-finished product with highly reliable binding capacity; the bonding is made at 360° C. and 150 kPa;

(5) remove the GaAs substrate from the semi-finished product in Step 4), and place the semi-finished product after bonding to a substrate remover solution for 30 min and then the light emitting diode chip with transparent substrate is obtained; the substrate remover solution is prepared by NH$_4$OH and H$_2$O$_2$ at a volume ratio of 1:5, and the temperature of the substrate remover is 45° C.

Embodiment 3

A method for preparing the above four-element light emitting diode with transparent substrate comprises the following steps:

(1) roughen the surface of a GaP layer of the AlGaInP-LED epitaxial wafer into a bonding surface, and plate SiNx/Al$_2$O$_3$/SiO$_2$ films respectively on the bonding surface by electronic beam; the SiO$_2$ film is 4 μm thick as the thickness of the layer to be polished should be sufficient for subsequent well polishing to certain flatness.

The GaP surface in roughened in the following steps:

(a) add 10 g I2 powder to 1,600 ml CH$_3$COOH, stir the solution till it is homogeneous and then heat the solution to 43° C.;

(b) after the solution prepared in Step (a) is kept at a stable temperature, add the mixture of HF, HNO$_3$ and CH$_3$COOH at a volume ratio of 3:2:4 and then maintain the temperature of the solution at 38° C.; further, the volume ratio of CH$_3$COOH at this step to CH$_3$COOH at Step a) is 1:5;

(c) roughen AlGaInP-LED epitaxial wafer in the solution prepared in Step (b) for 1.5 min.

(2) smoothen the surface of the film layer on the bonding surface in Step 1) to be Ra<1 nm to obtain a smooth light emitting diode chip; the smoothening follows the chemical mechanical polishing procedures with the support of ESR-320 polishing solution and SUBA600SiO$_2$ polishing pad to obtain the required flatness;

(3) prepare the transparent sapphire substrate to be bonded, and place the light emitting diode chip smoothened in Step (2) and transparent substrate after cleaning in an activating agent and stir the solution for 10 min before taking them out; the contact between the polished film material and the activating agent can generate free radical such as hydrogen bond, increasing the binding capacity of the hydrogen bond between the film and the transparent substrate. The activating agent is the mixture of NH$_4$OH and H$_2$O$_2$ at volume ratio of 1:1;

(4) bond the light emitting diode chip with the transparent sapphire substrate after they are activated in Step 3) and then bond them at high temperature and pressure to obtain the bonded semi-finished product with highly reliable binding capacity; the bonding is made at 360° C. and 150 kPa;

(5) remove the GaAs substrate from the semi-finished product in Step (4), and place the semi-finished product after bonding in a substrate remover solution for 30 min and then the light emitting diode chip with transparent substrate is obtained; the substrate remover solution is prepared by NH$_4$OH and H$_2$O$_2$ at a volume ratio of 1:5, and the temperature of the substrate remover is 45° C.

Embodiment 4

A method for preparing the above four-element light emitting diode with transparent substrate comprises the following steps:

(1) roughen the surface of a GaP layer of the AlGaInP-LED epitaxial wafer into a bonding surface, and plate Al$_2$O$_3$/SiO$_2$ films respectively on the bonding surface by electronic beam; the SiO$_2$ film is 2.5 μm thick as the thickness of the layer to be polished should be sufficient for subsequent well polishing to certain flatness.

The GaP surface is roughened in the following steps:

(a) add 10 g I2 powder to 1,600 ml CH$_3$COOH, stir the solution till it is homogeneous and then heat the solution to 45° C.;

(b) after the solution prepared in Step (a) is kept at a stable temperature, add the mixture of HF, HNO$_3$ and CH$_3$COOH at a volume ratio of 3:2:4 and then maintain the temperature of the solution at 38° C.; further, the volume ratio of CH$_3$COOH at this step to CH$_3$COOH at Step a) is 1:5;

(c) roughen AlGaInP-LED epitaxial wafer in the solution prepared in Step (b) for 2 min.

(2) smoothen the surface of the film layer on the bonding surface in Step 1) to be Ra<1 nm to obtain a smooth light emitting diode chip; the smoothening follows the chemical mechanical polishing procedures with the support of ESR-320 polishing solution and SUBA600SiO$_2$ polishing pad to obtain the required flatness;

(3) prepare the transparent glass substrate to be bonded, and place the light emitting diode chip smoothened in Step 2) and transparent substrate after cleaning in an activating agent and stir the solution for 6 min before taking them out; the contact between the polished film material and the activating agent can generate free radical such as hydrogen bond, increasing the binding capacity of the hydrogen bond between the film and the transparent substrate. The activating agent is the mixture of NH$_4$OH and H$_2$O$_2$ at volume ratio of 1:1;

(4) bond the light emitting diode chip with the transparent glass substrate after they are activated in Step (3) and then bond them at high temperature and pressure to obtain the bonded semi-finished product with highly reliable binding capacity; the bonding is made at 360° C. and 150 kPa;

(5) remove the GaAs substrate from the semi-finished product in Step 4), and place the semi-finished product after bonding in a substrate remover solution for 30 min and then the light emitting diode chip with transparent substrate is obtained; the substrate remover solution is prepared by NH$_4$OH and H$_2$O$_2$ at a volume ratio of 1:5, and the temperature of the substrate remover is 45° C.

Embodiment 5

A method for preparing the above four-element light emitting diode with transparent substrate comprises the following steps:

(1) roughen the surface of a GaP layer of the AlGaInP-LED epitaxial wafer into a bonding surface, and plate Al$_2$O$_3$/SiO$_2$ films respectively on the bonding surface by electronic beam; the SiO$_2$ film is 3 μm thick as the thickness of the layer to be polished should be sufficient for subsequent well polishing to certain flatness;

The GaP surface is roughened in the following steps:

(a) add 10 g I2 powder to 1,600 ml CH$_3$COOH, stir the solution till it is homogeneous and then heat the solution to 43° C.;

(b) after the solution prepared in Step a) is kept at a stable temperature, add the mixture of HF, HNO$_3$ and CH$_3$COOH at a volume ratio of 3:2:4 and then maintain the temperature of the solution at 38° C.; further, the volume ratio of CH$_3$COOH at this step to CH$_3$COOH at Step a) is 1:5;

(c) roughen AlGaInP-LED epitaxial wafer in the solution prepared in Step b) for 1.5 min.

(2) smoothen the surface of the film layer on the bonding surface in Step 1) to be Ra<1 nm to obtain a smooth light emitting diode chip; the smoothening follows the chemical mechanical polishing procedures with the support of ESR-320 polishing solution and SUBA600SiO$_2$ polishing pad to obtain the required flatness;

(3) prepare the transparent MN substrate to be bonded, and place the light emitting diode chip smoothened in Step 2) and transparent substrate after cleaning in an activating agent and stir the solution for 10 min before taking them out; the contact between the polished film material and the activating agent can generate free radical such as hydrogen bond, increasing the binding capacity of the hydrogen bond between the film and the transparent substrate. The activating agent is the mixture of $NH_4OH$ and $H_2O_2$ at volume ratio of 1:1;

(4) bond the light emitting diode chip with the transparent AlN substrate after they are activated in Step (3) and then bond them at high temperature and pressure to obtain the bonded semi-finished product with highly reliable binding capacity; the bonding is made at 360° C. and 150 kPa;

(5) remove the GaAs substrate from the semi-finished product in Step 4), and place the semi-finished product after bonding to a substrate remover solution for 30 min and then the light emitting diode chip with transparent substrate is obtained; the substrate remover solution is prepared by $NH_4OH$ and $H_2O_2$ at a volume ratio of 1:5, and the temperature of the substrate remover is 45° C.

Figure 5:
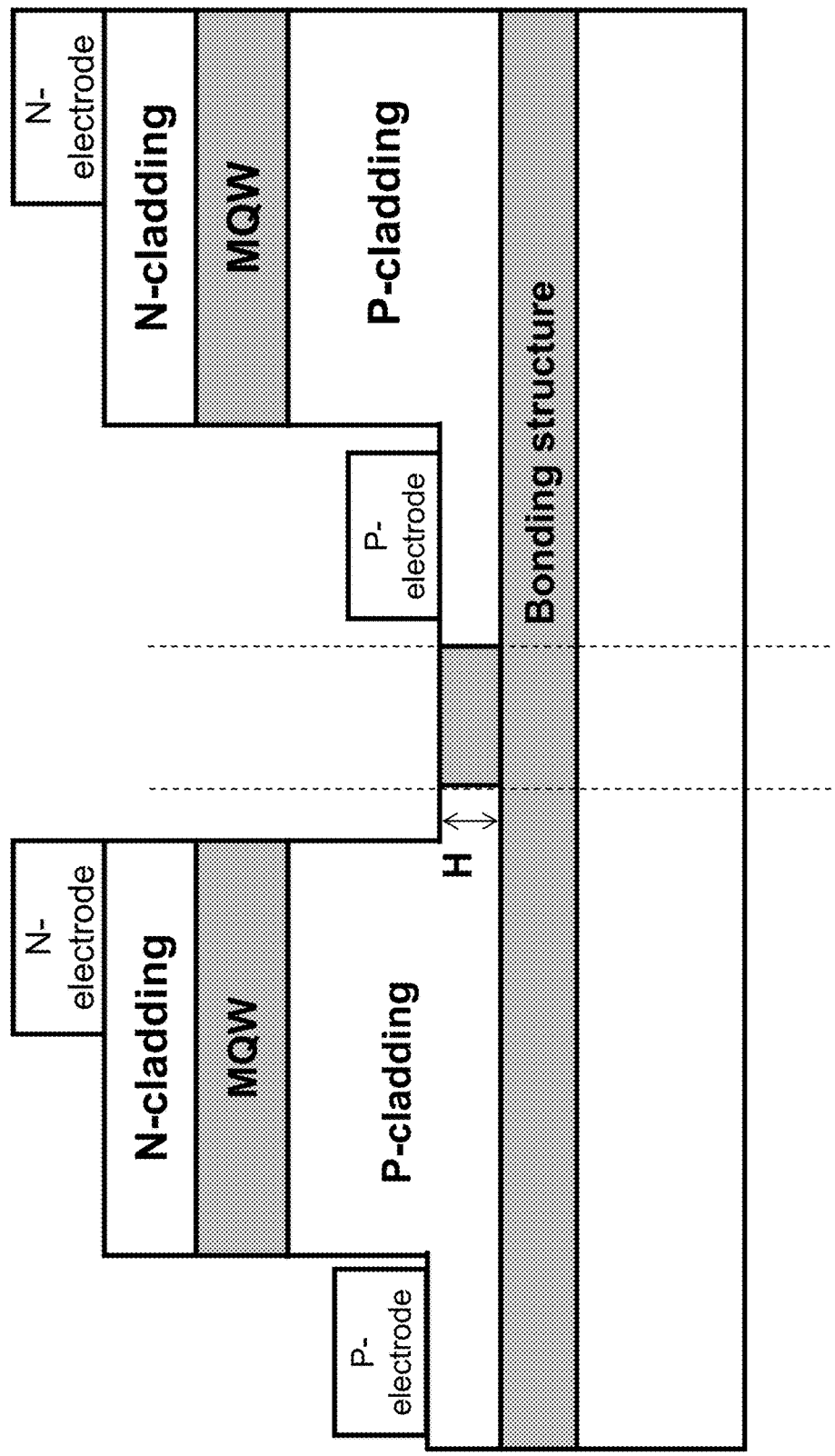
FIG. 5 is the structural diagram of the product after the completion of Step (5) according to some embodiments.
Figure 6:
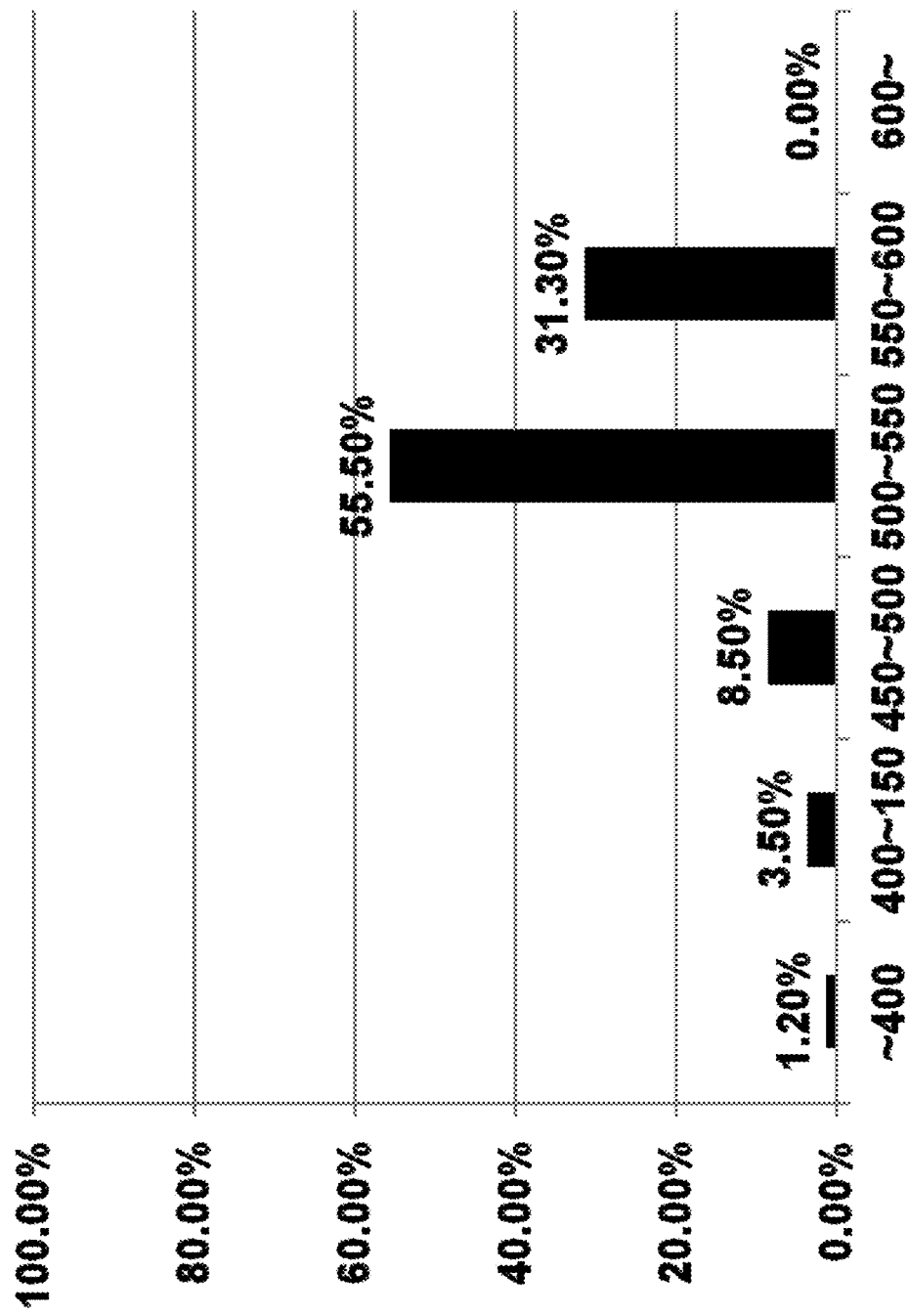
FIG. 6 is the distribution drawing of PWS probers for measuring axial light extracting mcd value of the four-element light emitting diode with transparent substrate.

As shown in FIG. 5, the area between two dotted lines is the corridor area, and the corridor area is to be cut to split the chip core, yet part of epitaxial P-cladding is left on the corridor, which is easily back melt and splashed to the side of the chip core when cutting operation by laser is performed, thus resulting in electric leakage and shielding and further influencing the light extracting rate and greatly lowering light extracting efficiency after the chip core is split. To solve the problem, the epitaxial layer on the corridor area is first etched (dry etching is preferable) before cutting to a depth of at least ½ of the thickness H of the epitaxial layer, by which the back melting to the chip core side on the epitaxial layer can be avoided during cutting operation to eliminate electric leakage and light extracting shielding.

Light emitting efficiency tests are performed to the light emitting diode chips with transparent substrate obtained in Embodiments 1-5 and a control group is also provided, among them, the vertically structural light emitting diodes with metal ODR are provided for control group, and 12 mil light emitting diode chips are available for each embodiment and the control group and their testing results are shown in the following Table 1.

In the table, mapping data are the axial light extracting value measured by PWS probers; encapsulation data are the light extracting data measured by integrating sphere after the light is covered and glue is applied, and the current for testing is always 20 mA. The table above shows that the light extracting efficiency of the light emitting diode with transparent substrate is higher than that of the control group.

The light emitting diode chips with transparent substrate obtained in Embodiments 1-5 have a conforming rate of up to 95% in transparent bonding.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A four-element light emitting diode (LED) with a transparent substrate, comprising an AlGaInP LED epitaxial wafer, wherein: a surface of a GaP layer of the AlGaInP LED epitaxial wafer is roughened into a bonding surface, a film is plated on the bonding surface and is bonded with a transparent substrate, and a GaAs substrate is removed to form the LED with the transparent substrate, wherein the LED is prepared with a method comprising:
 (1) roughen a surface of the GaP layer of the AlGaInP LED epitaxial wafer into the bonding surface, and plate the film on the bonding surface;
 (2) smoothen a surface of the film layer on the bonding surface in Step (1) to be Ra<1 nm, to obtain a smooth LED chip;
 (3) prepare the transparent substrate to be bonded, and place the LED chip smoothened in Step (2) and the transparent substrate, after cleaning, in an activating agent, and stir the activating agent for 5-10 min prior to taking out the activated LED chip and transparent substrate;
 (4) bind the LED chip with the transparent substrate after activation in Step (3) and then the LED chip and the transparent substrate at high temperature and pressure to obtain a bonded semi-finished product;
 (5) remove the GaAs substrate from the semi-finished product in Step (4) to thereby convert the LED chip into the LED with the transparent substrate.

2. The LED of claim 1, wherein: the film is an electronic beam evaporation material.

TABLE 1

Comparison between Embodiments 1 through 5 and a control group

| | LED structure | | Mapping data | | | Encapsulation data | | | |
| --- | --- | --- | --- | --- | --- | --- | --- | --- | --- |
| Embodiment | Bonding structure | Substrate material | Vf (V) | Iv avg (mcd) | Wld (nm) | Vf (V) | φ (lm) | Wld (nm) | Eff (lm/W) |
| 1 | $Al_2O_3/SiO_2$ | Sapphire | 2.12 | 525 | 619.2 | 2.12 | 4.1 | 619.2 | 96.70 |
| 2 | $SiNx/SiO_2$ | Sapphire | 2.12 | 547 | 619 | 2.12 | 4.4 | 619 | 103.77 |
| 3 | $SiNx/Al_2O_3/SiO_2$ | Sapphire | 2.11 | 541 | 619.5 | 2.11 | 4.3 | 619.5 | 101.90 |
| 4 | $Al_2O_3/SiO_2$ | Glass | 2.11 | 533 | 618.9 | 2.11 | 4.3 | 618.9 | 101.90 |
| 5 | $Al_2O_3/SiO_2$ | AlN | 2.12 | 524 | 619 | 2.12 | 4.1 | 619 | 96.70 |
| Control group | Au—Au bonding | Si | 2.09 | 386 | 620 | 2.09 | 3.2 | 620 | 76.55 |

3. The LED of claim 1, wherein: the film comprises at least one of a silicon oxide layer, a silicon nitride layer, an aluminum oxide layer, or a magnesium chloride layer.

4. The LED of claim 1, wherein: the transparent substrate is made of sapphire, aluminum oxide, or glass.

5. A method for preparing a four-element light emitting diode (LED) with a transparent substrate, the method comprising:
   (1) roughen a surface of a GaP layer of an AlGaInP LED epitaxial wafer into a bonding surface, and plate a film on the bonding surface;
   (2) smoothen a surface of the film layer on the bonding surface in Step (1) to be Ra<1 nm, to obtain a smooth LED chip;
   (3) prepare the transparent substrate to be bonded, and place the LED chip smoothened in Step (2) and the transparent substrate, after cleaning, in an activating agent, and stir the activating agent for 5-10 min prior to taking out the activated LED chip and transparent substrate;
   (4) bind the LED chip with the transparent substrate after activation in Step (3) and then bond the LED chip and the transparent substrate at high temperature and pressure to obtain a bonded semi-finished product;
   (5) remove a GaAs substrate from the semi-finished product in Step (4) to thereby convert the LED chip into the LED with the transparent substrate.

6. The method of claim 5, further comprising a Step (6) where the epitaxial layer at a corridor area of a path to be cut on the LED with the transparent substrate obtained in Step (5) is etched to a depth of at least ½ of a thickness of the epitaxial layer.

7. The method of claim 6, wherein: in Step (1), the surface of a GaP layer of the AlGaInP-LED epitaxial wafer is roughened following:
   (a) add at least 10 g I2 powder to 1600 ml $CH_3COOH$, stir a solution till the solution is homogeneous and then heat the solution to 40-45° C.;
   (b) after the solution prepared in Step (a) is at a stable temperature, add a mixture of HF, $HNO_3$ and $CH_3COOH$ at a volume ratio of 3:2:4 and then maintain the temperature of the solution at 35-40° C.; further, a volume ratio of $CH_3COOH$ at this step to $CH_3COOH$ at Step (a) is 1:5;
   (c) roughen AlGaInP-LED epitaxial wafer in the solution prepared in Step (b) for 1-2 min.

8. The method of claim 6, wherein: in Step (3), the activating agent is a solution containing hydrogen peroxide compound.

9. The method of claim 8, wherein the activating agent is a mixture of $NH_4OH$ and $H_2O_2$ at ambient temperature with volume ratio of 1:1.

10. The method of claim 6, wherein: in Step (4), the bonding is made at 360° C. and 150 kPa for at least 30 min.

11. The method of claim 6, wherein: in Step (5), the removing of the GaAs substrate comprises: placing the semi-finished product after bonding in Step (4) for 30 min in a substrate remover solution, wherein the substrate remover solution is a mixture of $NH_4OH$ and $H_2O_2$ at a volume ratio of 1:5, and a temperature of the substrate remover is 45° C.

12. A light-emitting system including a plurality of four-element light emitting diodes (LEDs) with transparent substrates, each comprising an AlGaInP LED epitaxial wafer, wherein: each LED with a transparent substrate is made by a method comprising:
   (1) roughen a surface of a GaP layer of an AlGaInP LED epitaxial wafer into a bonding surface, and plate a film on the bonding surface;
   (2) smoothen a surface of the film layer on the bonding surface in Step (1) to be Ra<1 nm, to obtain a smooth LED chip;
   (3) prepare the transparent substrate to be bonded, and place the LED chip smoothened in Step (2) and the transparent substrate, after cleaning, in an activating agent, and stir the activating agent for 5-10 min prior to taking out the activated LED chip and transparent substrate;
   (4) bind the LED chip with the transparent substrate after activation in Step (3) and then bond the LED chip and the transparent substrate at high temperature and pressure to obtain a bonded semi-finished product;
   (5) remove a GaAs substrate from the semi-finished product in Step (4) to thereby convert the LED chip into the LED with the transparent substrate.

13. The system of claim 12, wherein the method further comprises a Step (6) where the epitaxial layer at a corridor area of a path to be cut on the LED with the transparent substrate obtained in Step (5) is etched to a depth of at least ½ of a thickness of the epitaxial layer.

14. The system of claim 13, wherein: in Step (1), the surface of a GaP layer of the AlGaInP-LED epitaxial wafer is roughened by:
   (a) add at least 10 g I2 powder to 1600 ml $CH_3COOH$, stir a solution till it is homogeneous and then heat the solution to 40-45° C.;
   (b) after the solution prepared in Step (a) is at a stable temperature, add a mixture of HF, $HNO_3$ and $CH_3COOH$ at a volume ratio of 3:2:4 and then maintain the temperature of the solution at 35-40° C.; further, a volume ratio of $CH_3COOH$ at this step to $CH_3COOH$ at Step (a) is 1:5;
   (c) roughen AlGaInP-LED epitaxial wafer in the solution prepared in Step (b) for 1-2 min.

15. The system of claim 13, wherein: in Step (3), the activating agent is a solution containing hydrogen peroxide compound.

16. The system of claim 15, wherein the activating agent is a mixture of $NH_4OH$ and $H_2O_2$ at ambient temperature with volume ratio of 1:1.

17. The system of claim 13, wherein: in Step (4), the bonding is made at 360° C. and 150 kPa for at least 30 min.

18. The system of claim 13, wherein: in Step (5), the removing of the GaAs substrate comprises: placing the semi-finished product after bonding in Step (4) for 30 min in a substrate remover solution, wherein the substrate remover solution is a mixture of $NH_4OH$ and $H_2O_2$ at a volume ratio of 1:5, and a temperature of the substrate remover is 45° C.

19. The system of claim 12, wherein: the film is an electronic beam evaporation material and comprises at least one of a silicon oxide layer, a silicon nitride layer, an aluminum oxide layer, or a magnesium chloride layer.

20. The system of claim 19, wherein: the transparent substrate is made of sapphire, aluminum oxide, or glass.

* * * * *